United States Patent [19]
Kishimoto

[11] Patent Number: 6,040,709
[45] Date of Patent: Mar. 21, 2000

[54] TERNARY SIGNAL INPUT CIRCUIT

[75] Inventor: Kazunori Kishimoto, Tokyo, Japan

[73] Assignee: NEC Corporation, Tokyo, Japan

[21] Appl. No.: 09/082,561

[22] Filed: May 21, 1998

[30] Foreign Application Priority Data

May 30, 1997 [JP] Japan .................................... 9-141696

[51] Int. Cl.[7] .......................... H03K 19/01; H03K 19/02
[52] U.S. Cl. ................................ 326/59; 326/59; 326/60; 326/82; 326/86
[58] Field of Search ............................. 326/59, 60, 82, 326/86, 90, 31

[56]  References Cited

U.S. PATENT DOCUMENTS 4,631,428  12/1986  Grimes ....................................... 326/59
4,808,854  2/1989  Reinagal ..................................... 326/59

*Primary Examiner*—Michael Tokar
*Assistant Examiner*—Vibol Tan
*Attorney, Agent, or Firm*—Scully, Scott, Murphy & Presser

[57]  ABSTRACT

A ternary signal input circuit includes two inverters having opposite hysteresis characteristics, respectively, a NOR gate for producing an output signal indicative of an inversion of the logical sum of output signals from the inverters, and a AND gate for producing an output signal indicative of the logical product of output signals from the inverters. The ternary signal input circuit, composed only of digital components, converts a ternary signal supplied through a transformer into binary signals and outputs the binary signals. The ternary signal input circuit has a relatively simple circuit arrangement and will take up a relatively small area on an LSI chip when it is incorporated into the LSI chip.

4 Claims, 7 Drawing Sheets

TERNARY SIGNAL INPUT CIRCUIT

BACKGROUND OF THE INVENTION

1. Field of the Invention

The present invention relates to a ternary signal input circuit for converting an input ternary signal into binary signals and outputting the binary signals.

2. Description of the Related Art

Communication systems which employ a ternary signal such as an AMI (Aletrnate Mark Inversion) code that is used by ISDN (Integrated Services Digital Network) basic interfaces require receiver circuits capable of receiving three potentials of input voltages.

Heretofore, ternary signal input circuits for use as receiver circuits for communications employing a ternary signal comprise a circuit composed of analog devices.

As shown in FIG. 1 of the accompanying drawings, such a conventional ternary signal input circuit comprises a transformer 10 for being supplied with a signal from a communication line, resistors 73, 74, 75 connected in series with each other between a power supply Vdd and ground, an analog comparator 76 having a first input terminal connected to the transformer 10 and a second input terminal connected to a junction between the resistors 73, 74, and an analog comparator 77 having a first input terminal connected to a junction between the resistors 74, 75 and a second input terminal connected to the transformer 10. The analog comparators 76, 77 have respective output terminals serving respectively as output terminals 78, 79 of the ternary signal input circuit.

Operation of the conventional ternary signal input circuit will be described below with reference to FIG. 2 of the accompanying drawings.

A signal from the communication line is supplied through the transformer 10 having a terminal 12 to which a potential equal to one half (½) of the voltage of the power supply Vdd.

As shown in FIG. 2, an input signal 11 that has passed through the transformer 10 selectively has the ½ Vdd potential, a (+) potential, and a (−) potential. These three alternative potentials represent data carried by the input signal 11.

In order to process the input signal with a digital circuit, it is necessary to convert the input signal into a binary signal having two alternative potentials such as a 0 potential and a Vdd potential.

Consequently, a signal converter for converting a ternary signal of three potentials into a binary signal of two potentials is necessary.

As shown in FIG. 1, the power supply voltage Vdd is divided by the three resistors 73, 74, 75 into a potential 71 slightly higher than the ½ Vdd potential and a potential 72 slightly lower than the ½ Vdd potential. These potentials 71, 72 are supplied to the analog comparators 76, 77, respectively, which compare the supplied potentials 71, 72 with the input signal 11 thereby to convert the ternary signal into a binary signal.

As shown in FIG. 3 of the accompanying drawings, if the input signal 11 is higher than the potential 71 that is slightly higher than the ½ Vdd potential, then the analog comparator 76 outputs the Vdd potential (see FIG. 2), and if the input signal 11 is lower than the potential 72 that is slightly lower than the ½ Vdd potential, then the analog comparator 77 outputs the Vdd potential (see FIG. 2). If the input signal is of a potential between the potentials 71, 72, then both the analog comparators 76, 77 output the 0 potential.

In this manner, the conventional ternary signal input circuit shown in FIG. 1 converts a ternary signal into two binary signals.

However, the conventional ternary signal input circuit suffers the following problems:

(1) Since usual digital devices have only two potentials such as the 0 potential and the Vdd potential, they cannot handle an input signal having three potentials. Therefore, the conventional ternary signal input circuit, which comprises analog devices, is complex in circuit arrangement, is made up of many components, and is expensive to manufacture.

(2) Analog devices such as analog comparators need many transistors as internal components. Because those transistors cannot individually be reduced in size with ease, the area taken up by the circuits on an LSI chip is relatively large. Consequently, when the circuits composed of those analog circuits are incorporated into an LSI chip, the LSI chip is relatively large in size and expensive to manufacture.

SUMMARY OF THE INVENTION

It is an object of the present invention to provide a ternary signal input circuit which has a relatively simple circuit arrangement and will take up a relatively small area on an LSI chip when it is incorporated into the LSI chip.

According to the present invention, a ternary signal input circuit includes first and second inverters for being supplied with a ternary signal, the first and second inverters having opposite hysteresis characteristics, respectively, a NOR gate for producing an output signal indicative of an inversion of the logical sum of output signals from the first and second inverters, and a AND gate for producing an output signal indicative of the logical product of output signals from the first and second inverters. The ternary signal input circuit converts a ternary signal supplied through a transformer into binary signals and outputs the binary signals.

Since the ternary signal input circuit is composed only of digital components, the ternary signal input circuit is simpler in circuit arrangement than conventional ternary signal input circuits which employ analog components.

Because transistors that make up digital components may be small in size, the digital components may also be small in size. Therefore, the ternary signal input circuit will take up a relatively small area on an LSI chip when it is incorporated into the LSI chip, and can be manufactured relatively inexpensively.

The above and other objects, features, and advantages of the present invention will become apparent from the following description with reference to the accompanying drawings which illustrate an example of the present invention.

BRIEF DESCRIPTION OF THE DRAWINGS

FIG. 6b is a flowchart of an operation sequence of the inverter whose hysteresis characteristic is shown in FIG. 6a;

FIG. 7b is a flowchart of an operation sequence of the inverter whose hysteresis characteristic is shown in FIG. 7a.

DETAILED DESCRIPTION OF THE PREFERRED EMBODIMENT

Figure 4:
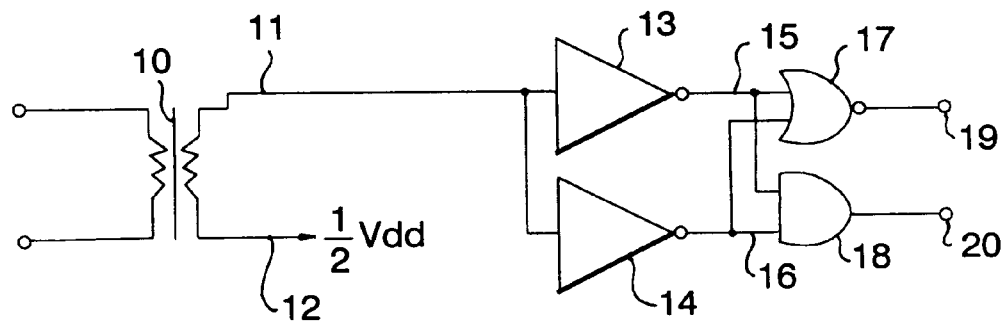
FIG. 4 is a circuit diagram of a ternary signal input circuit according to the present invention.

As shown in FIG. 4, a ternary signal input circuit according to the present invention comprises a transformer 10 for being supplied with a signal from a communication line, a pair of first and second inverters 13, 14 for being supplied with a signal from the transformer 10, the first and second inverters 13, 14 having opposite hysteresis characteristics, a NOR gate 17 for NORing output signals from the first and second inverters 13, 14, i.e., outputting a signal which is an inversion of the logical sum of output signals from the first and second inverters 13, 14, and an AND gate 18 for ANDing output signals from the first and second inverters 13, 14, i.e., outputting a signal which is the logical product of output signals from the first and second inverters 13, 14. The NOR gate 17 and the AND gate 18 have respective output terminals serving respectively as output terminals 19, 20 of the ternary signal input circuit.

Hysteresis characteristics of the inverters 13, 14 will be described below.

Figure 5:
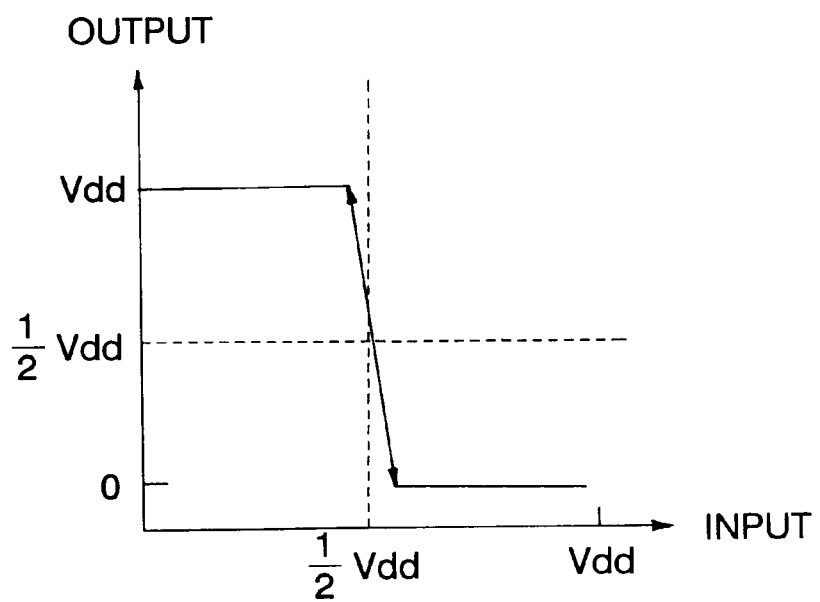
FIG. 5 is a diagram showing a hysteresis characteristic of a general inverter.

A general inverter has a hysteresis characteristic as shown in FIG. 5. According to the hysteresis characteristic shown in FIG. 5, an output signal from the general inverter depends on a ½ Vdd potential intermediate between a 0 potential and a Vdd potential.

Specifically, when an input signal having a potential lower than the ½ Vdd potential is supplied to the general inverter, the general inverter produces an output signal having the Vdd potential indicative of a logical high level, and when an input signal having a potential higher than the ½ Vdd potential is supplied to the general inverter, the general inverter produces an output signal having the 0 potential indicative of a logical low level.

Figure 6A:
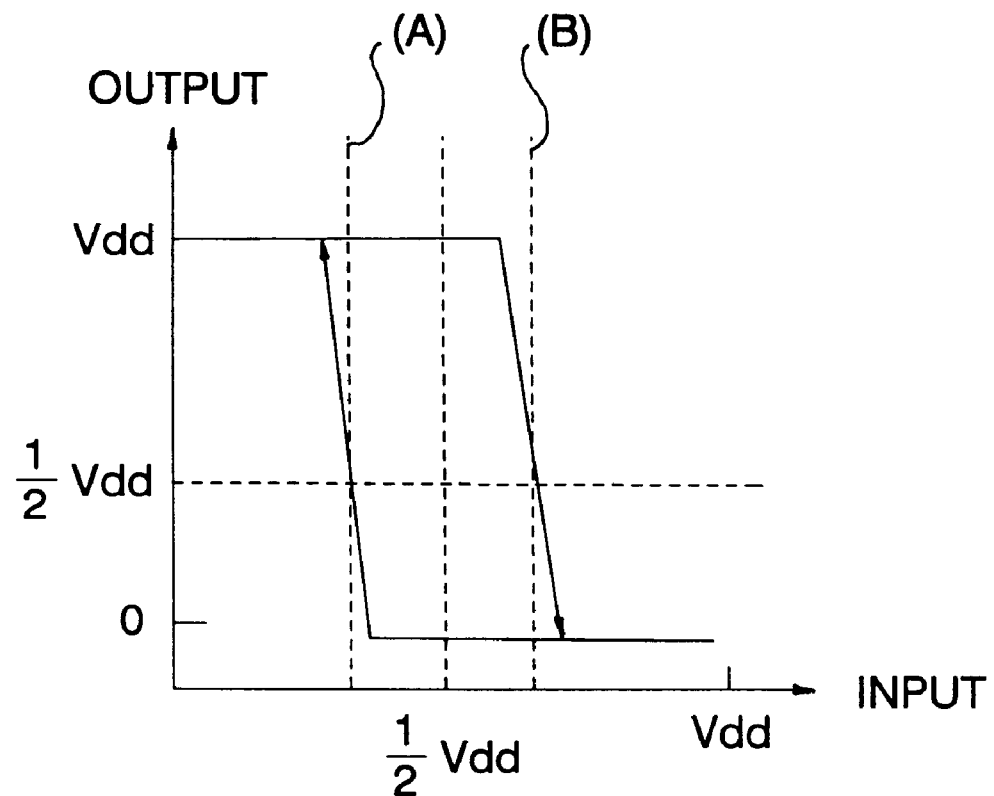
FIG. 6a is a diagram showing a hysteresis characteristic of one of inverters in the ternary signal input circuit shown in FIG. 4.
Figure 6:
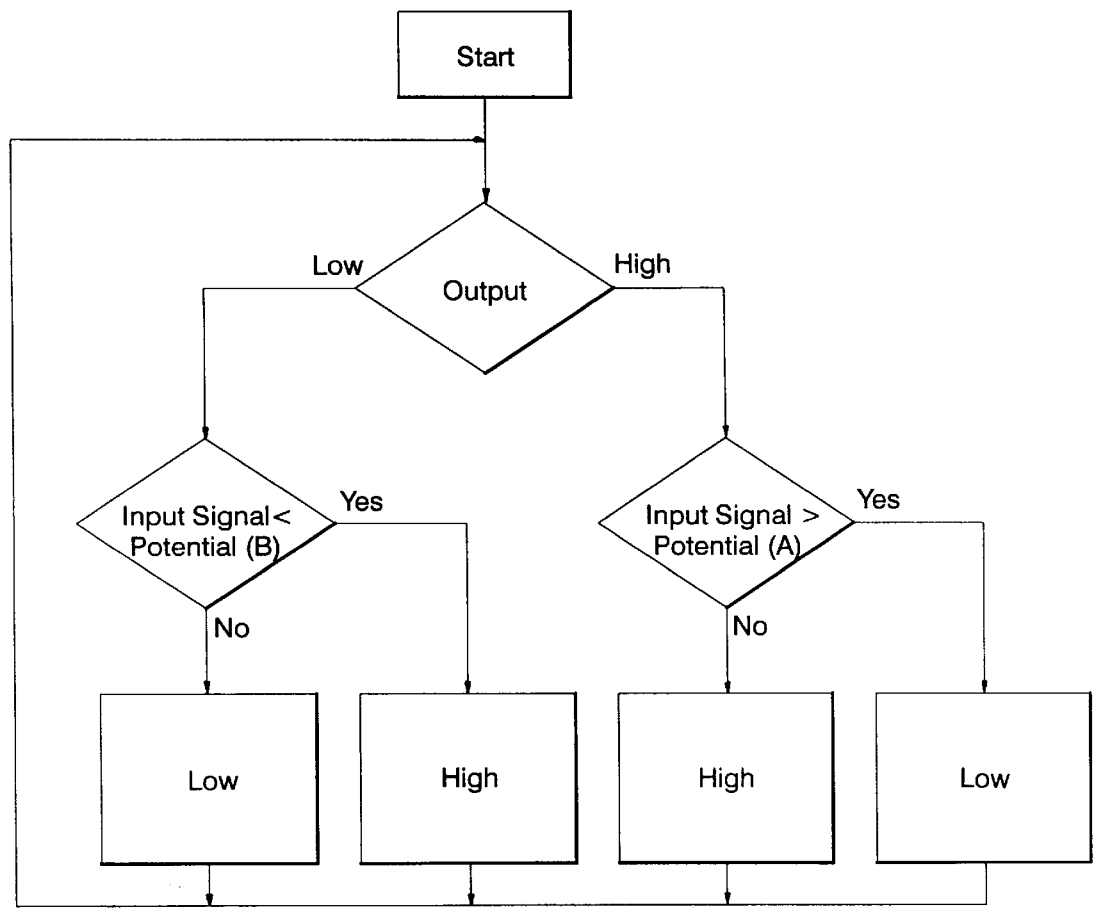

The inverter 13 in the ternary signal input circuit according to the present invention has a hysteresis characteristic as shown in FIG. 6a. As shown in FIG. 6b, when an input signal supplied to the inverter 13 has the Vdd potential which is of a logical high level, the inverter 13 produces an output signal having the 0 potential which is of a logical low level. In order to invert the low-level output signal, i.e., in order to produce an output signal of a logical high level, it is necessary to apply an input signal having a potential lower than the ½ Vdd potential (see (A) in FIG. 6a) to the inverter 13. Conversely, in order to invert the high-level output signal which is produced by the low-level input signal, it is necessary to apply an input signal having a potential higher than the ½ Vdd potential (see (B) in FIG. 6a) to the inverter 13.

Inverters having such characteristics are also referred to as a Schmitt trigger.

Figure 7A:
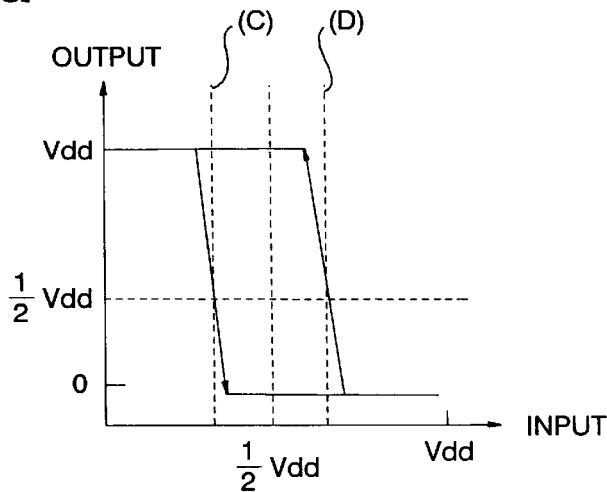
FIG. 7a is a diagram showing a hysteresis characteristic of another one of inverters in the ternary signal input circuit shown in FIG. 4.
Figure 7B:
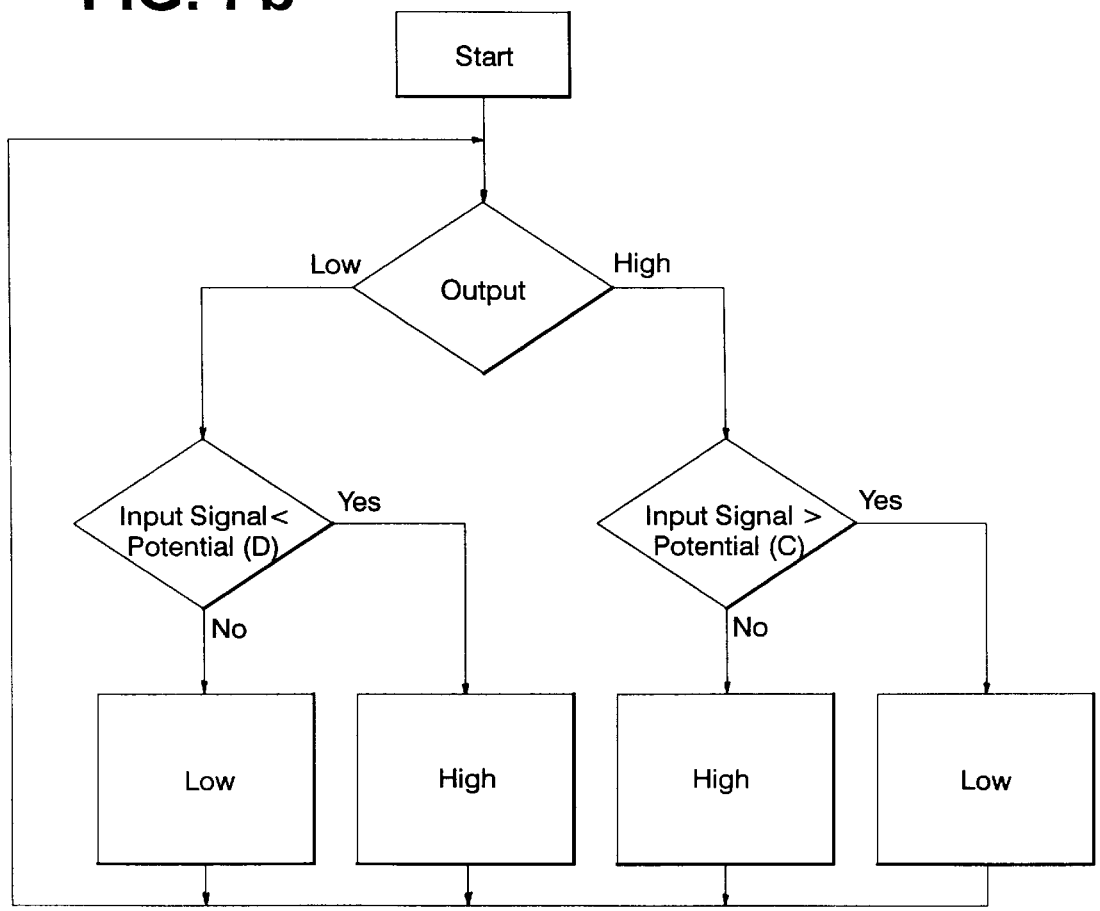

The inverter 14 in the ternary signal input circuit according to the present invention has a hysteresis characteristic as shown in FIG. 7a. The hysteresis characteristic of the inverter 14 is opposite to the hysteresis characteristic of the inverter 13. As shown in FIG. 7b, in order to invert the low-level output signal which is produced by the high-level output signal, it is necessary to apply an input signal having a potential higher than the ½ Vdd potential (see (D) in FIG. 7a) to the inverter 14. Conversely, in order to invert the high-level output signal which is produced by the low-level input signal, it is necessary to apply an input signal having a potential lower than the ½ Vdd potential (see (C) in FIG. 7a) to the inverter 14.

Operation of the ternary signal input circuit according to the present invention will be described below with reference to FIG. 8.

A signal from the communication line is supplied through the transformer 10 having a terminal 12 to which a potential equal to one half (½) of the power supply voltage Vdd.

Figure 8:
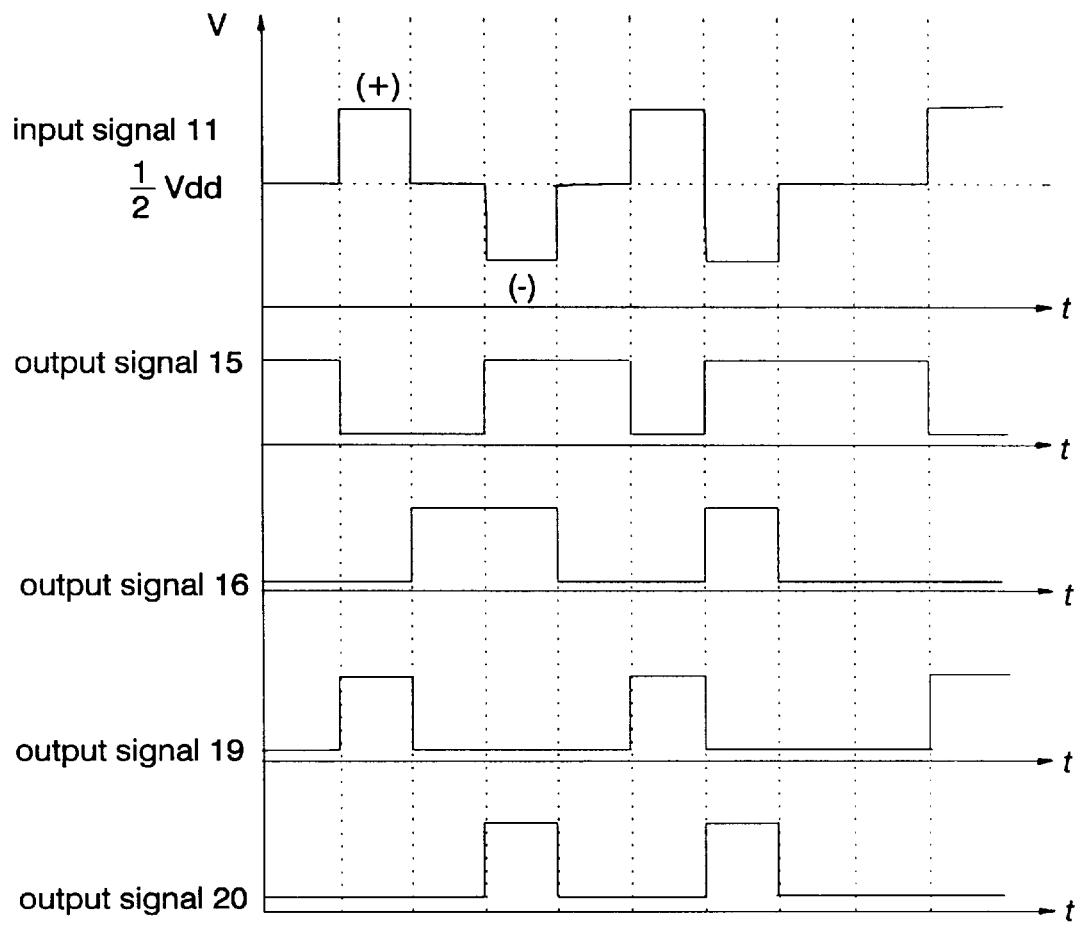
FIG. 8 is diagram illustrative of the manner in which the ternary signal input circuit shown in FIG. 4 operates.

As shown in FIG. 8, an input signal 11 that has passed through the transformer 10 selectively has the ½ Vdd potential, a (+) potential, and a (−) potential. These three alternative potentials represent data carried by the input signal 11, and the data is supplied to the inverters 13, 14.

While the input signal shown 11 in FIG. 8 is applied to the inverter 13, the inverter 13 produces an output signal having the logic low level when the input signal 11 has the (+) potential, and continuously produces same output signal having the logic low level even when the input signal 11 has the ½ Vdd potential. When the input signal 11 has the (−) potential, the output signal 15 from the inverter 13 is inverted, and the inverter 13 produces an output signal having the logic low level. The inverter 13 produces an output signal having the logic high level when the input signal 11 has the (−) potential, and continuously produces the same output signal having the logic high level even when the input signal 11 has the ½ Vdd potential. When the input signal 11 has the (+) potential, the output signal 15 from the inverter 13 is inverted, and the inverter 13 produces an output signal having the logic low level. Therefore, the output signal 15 from the inverter 13 has a waveform as shown in FIG. 8.

While the input signal 11 shown in FIG. 8 is applied to the inverter 14, the inverter 14 produces an output signal having the logic low level when the input signal 11 has the (+) potential. When the input signal 11 has the ½ Vdd potential, the output signal 16 from the inverter 14 is inverted, and the inverter 14 produces an output signal having the logic high level. The inverter 14 produces an output signal having the logic high level when the input signal 11 has the (−) potential. When the input signal 11 has the ½ Vdd potential, the output signal 16 from the inverter 14 is inverted, and the inverter 14 produces an output signal having the logic low level. Therefore, the output signal 16 from the inverter 14 has a waveform as shown in FIG. 8.

The output signals 15, 16 from the inverters 13, 14 are applied to the NOR gate 17 and the AND gate 18. The NOR gate 17 produces an output signal as shown in FIG. 8 from the output terminal 19, and the AND gate 18 produces an output signal as shown in FIG. 8 from the output terminal 20.

Figure 1:
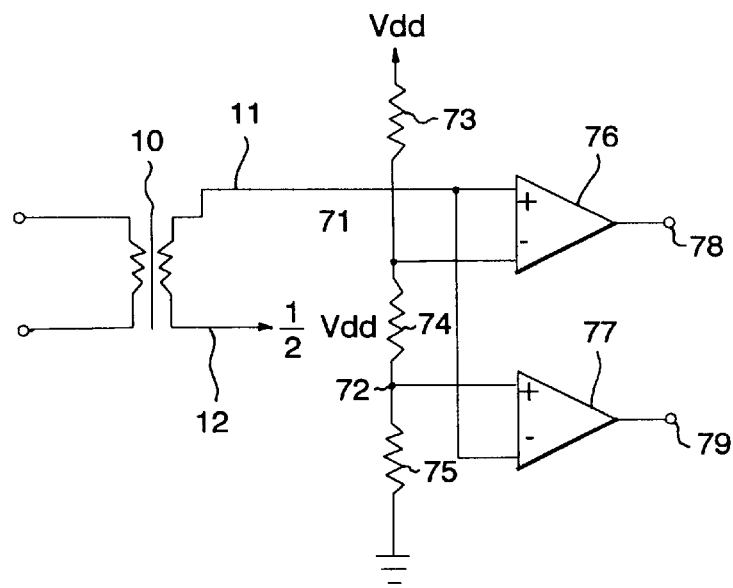
FIG. 1 is a circuit diagram of a conventional ternary signal input circuit.
Figure 2:
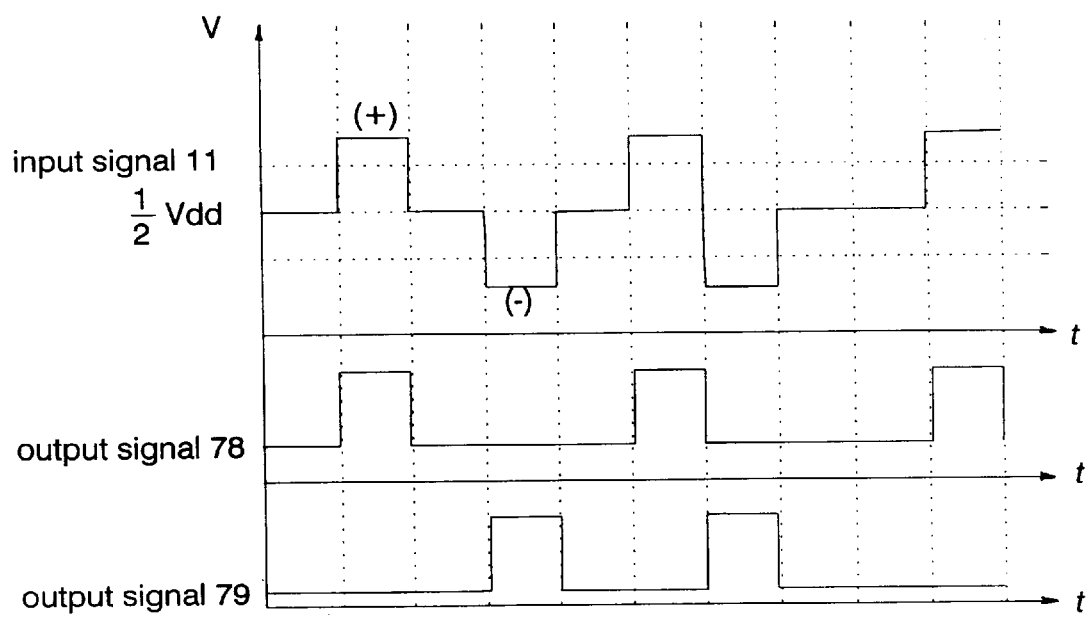
FIG. 2 is diagram illustrative of the manner in which the conventional ternary signal input circuit shown in FIG. 1 operates.
Figure 3:
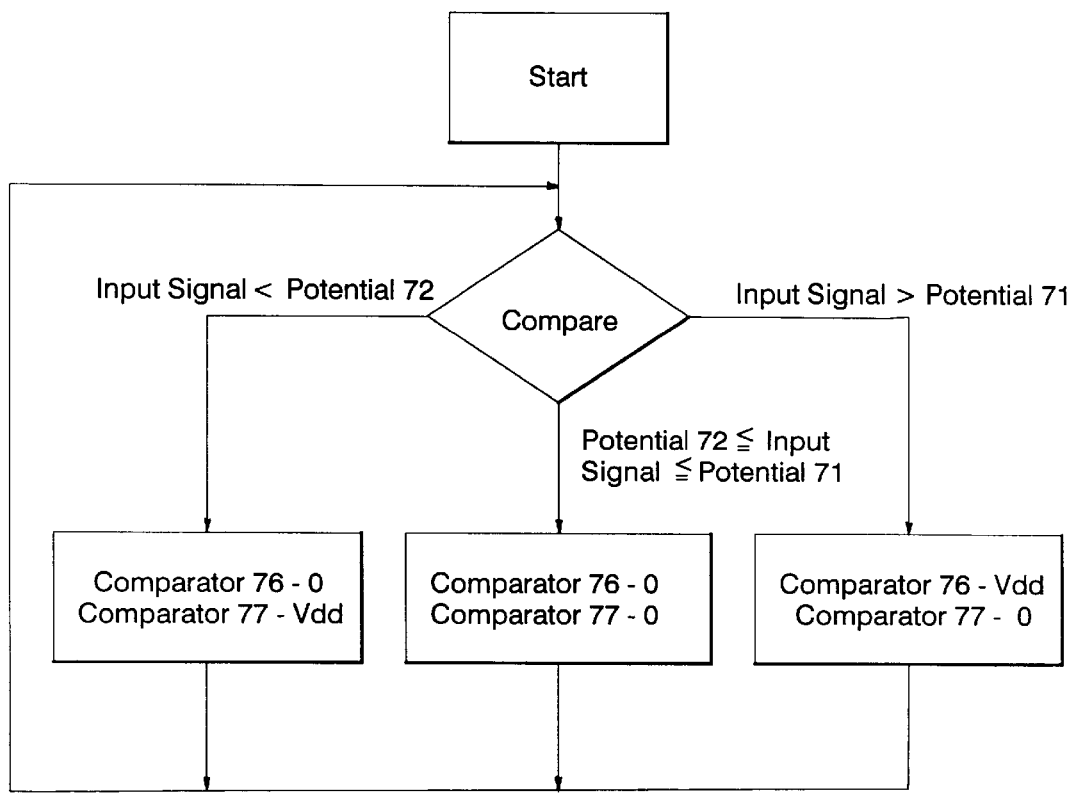
FIG. 3 is a flowchart of a process of converting a ternary signal into a binary signal with the conventional ternary signal input circuit shown in FIG. 1.

The output signals 19, 20 shown in FIG. 8 are equivalent to the output signals produced by the conventional ternary signal input circuit as shown in FIG. 2, and represent two binary signals converted from a signal ternary signal.

While a preferred embodiment of the present invention has been described using specific terms, such description is for illustrative purposes only, and it is to be understood that changes and variations may be made without departing from the spirit or scope of the following claims.

What is claimed is:

1. A ternary signal input circuit for converting a ternary signal supplied through a transformer into binary signals and outputting the binary signals, comprising:
    a first inverter for being supplied with the ternary signal;
    a second inverter for being supplied with the ternary signal, said first inverter and said second inverter having opposite hysteresis characteristics, respectively;
    a NOR gate for producing an output signal indicative of an inversion of the logical sum of output signals from said first and second inverters; and
    an AND gate for producing an output signal indicative of the logical product of output signals from said first and second inverters.

2. A ternary signal input circuit according to claim 1, wherein said first inverter has a Schmitt trigger hysteresis characteristic.

3. A ternary signal input circuit according to claim 1, wherein said ternary signal represents data alternatively with a first potential, a second potential, and an intermediate potential between said first potential and said second potential.

4. A ternary signal input circuit according to claim 2, wherein said ternary signal represents data alternatively with a first potential, a second potential, and an intermediate potential between said first potential and said second potential.

* * * * *